(12) United States Patent
Dimitrijev et al.

(10) Patent No.: US 10,971,580 B2
(45) Date of Patent: Apr. 6, 2021

(54) SILICON CARBIDE SCHOTTKY DIODES WITH TAPERED NEGATIVE CHARGE DENSITY

(71) Applicant: GRIFFITH UNIVERSITY, Nathan (AU)

(72) Inventors: Sima Dimitrijev, Nathan (AU); Jisheng Han, Nathan (AU)

(73) Assignee: GRIFFITH UNIVERSITY, Queensland (AU)

(*) Notice: Subject to any disclaimer, the term of this patent is extended or adjusted under 35 U.S.C. 154(b) by 0 days.

(21) Appl. No.: 16/469,809

(22) PCT Filed: Dec. 13, 2017

(86) PCT No.: PCT/AU2017/051377
§ 371 (c)(1),
(2) Date: Jun. 14, 2019

(87) PCT Pub. No.: WO2018/107222
PCT Pub. Date: Jun. 21, 2018

(65) Prior Publication Data
US 2020/0091281 A1    Mar. 19, 2020

(30) Foreign Application Priority Data

Dec. 15, 2016  (NL) .................................. 2018006

(51) Int. Cl.
*H01L 29/872* (2006.01)
*H01L 29/16* (2006.01)
(Continued)

(52) U.S. Cl.
CPC ........ *H01L 29/0619* (2013.01); *H01L 21/308* (2013.01); *H01L 21/3065* (2013.01);
(Continued)

(58) Field of Classification Search
CPC ............. H01L 29/0619; H01L 29/0688; H01L 29/1608; H01L 29/6606; H01L 29/872–8725
See application file for complete search history.

(56) References Cited

U.S. PATENT DOCUMENTS

| 5,789,311 A * | 8/1998 | Ueno | H01L 29/1608 |
| | | | 257/E21.067 |
| 6,573,128 B1 * | 6/2003 | Singh | H01L 29/868 |
| | | | 257/E29.104 |

(Continued)

FOREIGN PATENT DOCUMENTS

| CN | 103065941 | 4/2013 |
| EP | 1170129 | 1/2002 |

(Continued)

OTHER PUBLICATIONS

International Search Report and Written Opinion issued in connection with International Patent Application No. PCT/AU2017/051377, dated Feb. 19, 2018, 9 pages.

(Continued)

*Primary Examiner* — Stephen M Bradley
*Assistant Examiner* — Gustavo G Ramallo
(74) *Attorney, Agent, or Firm* — Duane Morris LLP

(57) ABSTRACT

A silicon carbide (SiC) Schottky diode comprises a layer of N-type SiC and a layer of P-type SiC in contact with the layer of N-type SiC creating a P-N junction. An anode is in contact with both the layer of N-type SiC and the layer of P-type SiC creating Schottky contacts between the anode and both the layer of N-type SiC and the layer of P-type SiC. An edge of the layer of P-type SiC is electrically active and comprises a tapered negative charge density at the P-N junction, which can be achieved by a tapered or sloping edge the layer of P-type SiC.

13 Claims, 4 Drawing Sheets

(51) Int. Cl.
*H01L 29/06* (2006.01)
*H01L 21/3065* (2006.01)
*H01L 21/308* (2006.01)
*H01L 29/66* (2006.01)

(52) U.S. Cl.
CPC ...... *H01L 29/0688* (2013.01); *H01L 29/1608* (2013.01); *H01L 29/6606* (2013.01); *H01L 29/872* (2013.01)

(56) References Cited

U.S. PATENT DOCUMENTS

| | | | |
|---|---|---|---|
| 7,873,318 B2 | 1/2011 | Nagai et al. | |
| 8,368,165 B2 | 2/2013 | Richieri | |
| 2004/0265749 A1 | 12/2004 | Breuer et al. | |
| 2008/0048173 A1* | 2/2008 | Sadaka | H01L 27/0629 257/18 |
| 2011/0220918 A1* | 9/2011 | Sugai | H01L 29/872 257/77 |
| 2015/0069412 A1* | 3/2015 | Lee | H01L 29/66143 257/77 |
| 2016/0315169 A1* | 10/2016 | Yoshikawa | H01L 29/167 |

FOREIGN PATENT DOCUMENTS

| | | |
|---|---|---|
| EP | 0965146 B1 | 5/2008 |
| JP | 2012231019 | 11/2012 |
| WO | 2002045177 A2 | 6/2002 |
| WO | 2006122252 A2 | 11/2006 |

OTHER PUBLICATIONS

Ueno, et al., "Al/Ti Schottky Barrier Diodes with the Guard-Ring Termination for 6H—SiC", Proceedings of 1995 International Symposium on Power Semiconductor Devices & ICs, Yokohama, Japan, May 1995, Abstract.
Extended European Search Report dated Oct. 16, 2020 for corresponding European Application No. 17879836.9.

* cited by examiner

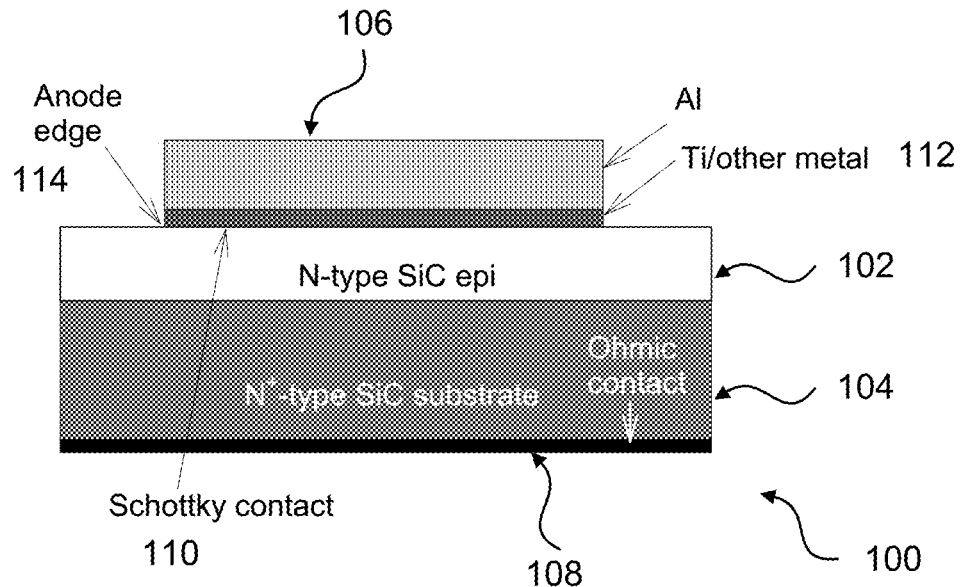
FIG. 1 – PRIOR ART
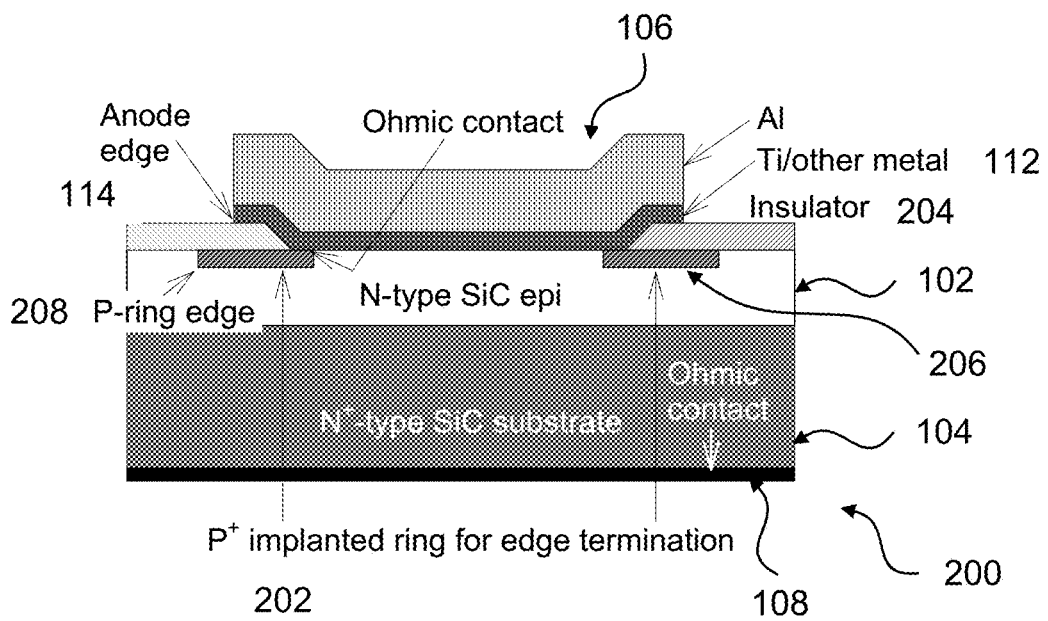
FIG. 2 – PRIOR ART

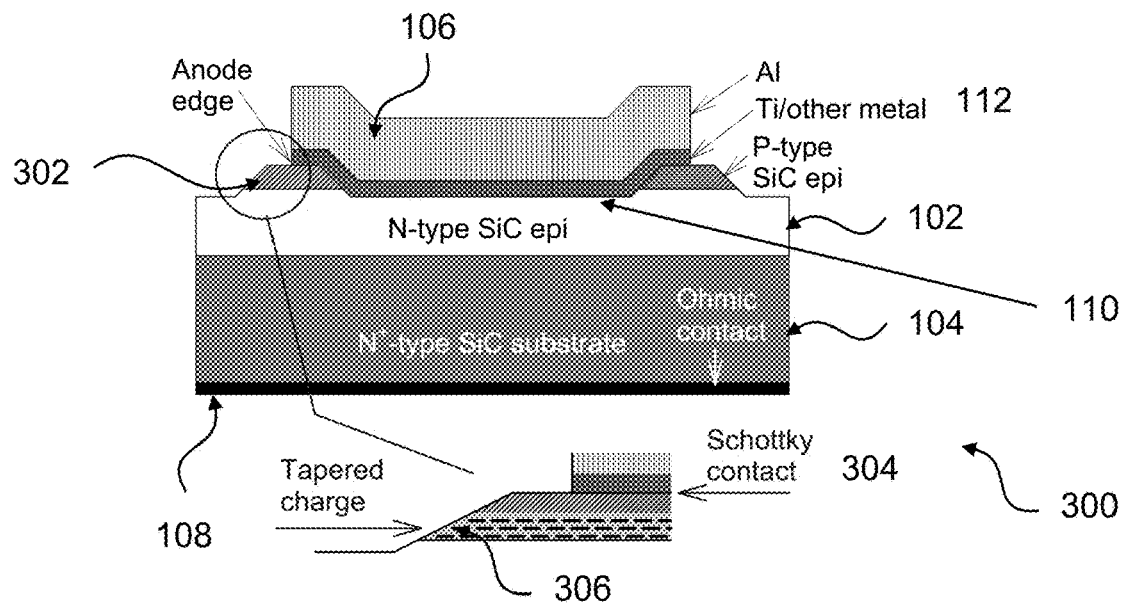
FIG. 3
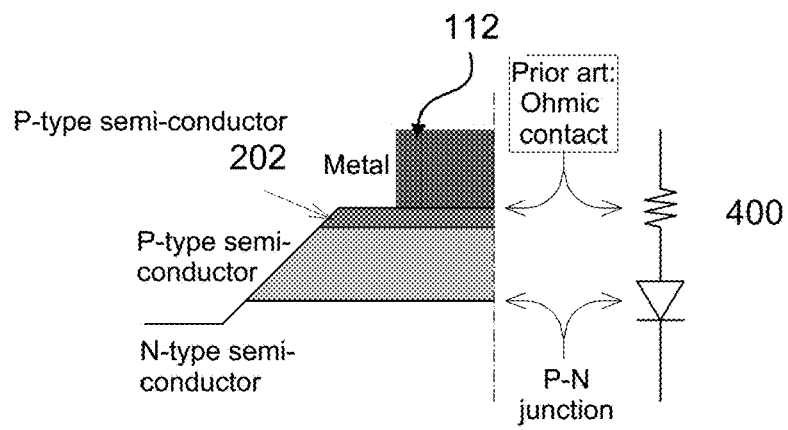
FIG. 4A - PRIOR ART
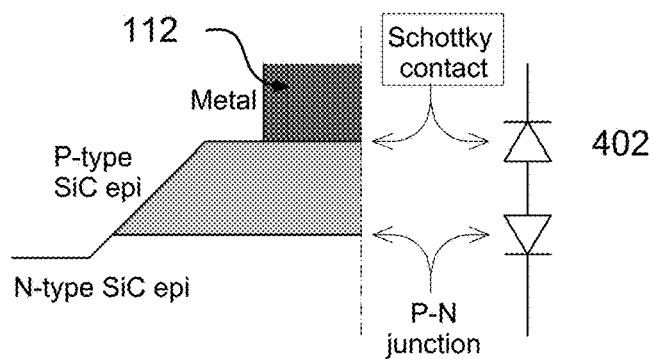
FIG. 4B

SILICON CARBIDE SCHOTTKY DIODES WITH TAPERED NEGATIVE CHARGE DENSITY

CROSS REFERENCE TO RELATED APPLICATIONS

This application is a National Stage Application, filed under 35 U.S.C. 371, of International Patent Application No. PCT/AU2017/051377, filed on Dec. 13, 2017, which claims priority to Netherlands Patent Application No. 2018006, filed on Dec. 15, 2016, contents of both of which are incorporated herein by reference in their entireties.

FIELD OF THE INVENTION

The present invention relates to silicon carbide Schottky diodes and methods of production of such diodes. In particular, the present invention relates to silicon carbide Schottky diodes comprising edge termination structures to reduce perimeter leakage.

BACKGROUND TO THE INVENTION

Schottky diodes utilize the conduction of electrons as the single type of current carriers to provide much faster switching in power-conversion circuits in comparison to bipolar P-N junction diodes, i.e. diode with two types of current carriers—electrons and holes. Silicon (Si)-based Schottky diodes are well established, but one of their characteristics that is undesirable in many applications is that they have a relatively low blocking voltage in reverse-bias mode. Silicon carbide (SiC) Schottky diodes provide much higher blocking voltages that are desirable in many applications. Analogously to the Si-based Schottky diodes, SiC Schottky diodes utilize the familiar rectifying properties of a metal-SiC contact.

The principle elements of a SiC Schottky diode 100, as they would be presented in an elementary textbook, are shown in FIG. 1. The Schottky diode 100 comprises a layer of N-type SiC 102 on an N⁺ type SiC substrate 104. An anode 106, typically formed of aluminium (Al) and a Schottky-contact metal 112, is formed on the layer of N-type SiC 102 and an Ohmic contact 108 is provided between the N⁺ type SiC substrate 104 and a circuit (not shown). The Schottky contact 110 is created between the metal layer 112 of the anode 106 and the layer of N-type SiC 102. The metal layer 112 is usually titanium (Ti), although many other metals are also successfully used. Practically, this diode structure is not useful because the negative charge, which accumulates at the edge 114 of the Schottky contact 110 when the diode is reverse biased increases the electric field in the SiC along the anode edge 114, causing high perimeter leakage. This can happen at very low reverse-bias voltages. A Schottky diode that is dominated by perimeter leakage cannot achieve the high blocking voltages that are determined by the reverse-bias current through the main area of the metal-SiC contact.

FIG. 2 shows a structure of another conventional SiC Schottky diode 200, which utilizes a P-type ring 202 in an edge-termination structure. Such edge termination structures are known from, for example, U.S. Pat. No. 8,368,165 assigned to Siliconix Technology C.V. and U.S. Pat. No. 7,973,318 assigned to Rohm Co. Ltd. The P-type ring 202 is embedded inside the layer of N-type SiC 102, which is the SiC region creating the Schottky contact 110 with the metal layer 112. The P-type ring 202 is in Ohmic contact with the metal layer 112 forming the Schottky contact with the layer of N-type SiC 102. This way, the anode edge 114, where the negative charge accumulates at reverse bias, is isolated from the layer of N-type SiC 102 by an insulator 204, or dielectric, and by a reverse biased P-N junction 206 created between the P-type ring 202 and the layer of N-type SiC 102. In this structure, the accumulation of negative charge occurs at the edge 208 of the P-type ring 202 and the layer of N-type SiC 102. The difference from the charge of electrons at the anode edge 114 is that the charge at the edge 208 of the P-type ring 202 is due to the acceptor atoms in the reverse-biased P-N junction 206, which are not mobile and cannot tunnel into the layer of N-type SiC 102 to cause perimeter leakage.

However, the accumulation of negative acceptor charge still increases the electric field at the edge 208 of the P-type ring 202, which can reach the levels at which leakage can occur due to band-to-band tunnelling of electrons at the P-N junction 206.

Various techniques have been developed to reduce the electric field at the edge 208 of the P-N junction. Some of these techniques involve a decreasing acceptor density in the P-type ring(s) 202 in the directions away from the metal-semiconductor contact, that is, toward the edge of the diode chip. European patent no. EP 0965146 assigned to Cree, Inc. discloses such techniques. When a diode with this kind of termination structure is reverse biased, the negative acceptor charge in the depletion layer is tapered, which reduces the peak of the electric field at the edge.

The embedding of the P-type rings 202 into the layer of N-type SiC 102 is achieved by embedding a higher concentration of acceptor atoms, usually aluminium (Al). The acceptor atoms convert the N-type doping inside the P-type ring 202 into effective P-type doping. In the case of SiC, ion implantation is the only effective method of converting N-type SiC into P-type SiC to create the embedded P-type ring 202. Ion implantation is a very effective and well-established method in Si technology, where both the displaced Si atoms and the implanted atoms diffuse when the Si is heated to around 1,000° C., which removes the ion-implantation damage and activates the implanted atoms as they diffuse into crystal-lattice positions. Diffusion of atoms in the much denser SiC requires much higher temperatures, ideally well above 2,000° C. These temperatures are not practical, but heating at around 1,600° C. can still activate some of the implanted acceptor atoms, which enabled commercialization of SiC Schottky diodes with the edge-termination structure shown in FIG. 2. Nonetheless, this process is expensive and some damage in the crystal remains. As a consequence, it is very difficult to implement this edge-termination structure in a way that maximizes the yield and the reliability of the fabricated Schottky diodes. Furthermore, multiple implantation steps with the associated photolithography are necessary to create an edge-termination structure with reducing charge density toward the edge of the diode chip. This approach results in significantly increased fabrication cost.

Hence, significant cost and reliability benefits can be achieved by manufacturing a SiC Schottky diode that does not require the use of ion implantation to produce the embedded P-type ring. Such an edge-termination structure is possible if a P-type epitaxial layer, grown on top of the N-type SiC layer, is utilized. In this case, the P-type epitaxial layer has to be removed from the main area of the diode to enable the Schottky contact between the metal anode and the underlying N-type SiC to be created.

A paper by Ueno et al., Proceedings of 1995 International Symposium on Power Semiconductor Devices & ICs, pages 107-111, Yokohama, Japan, May 1995, discloses a similar structure in which the P-type ring is achieved by local oxidation and subsequent removal of the grown oxide by etching to remove a portion of the P-type epitaxial layer to expose the N-type SiC layer. The Schottky contact with the exposed portion of the N-type SiC layer is created by depositing aluminium and titanium alternately by sputtering at room temperature on the N-type SiC layer followed by annealing at temperatures between 900° C. and 1,050° C. for 10 minutes. An Ohmic contact is created between the Al/Ti and the P-type ring, as shown in FIG. 2.

One problem with the structures and processes disclosed in Ueno et al. is that the high-temperature annealing can compromise the Schottky contact between the metal and the N-type SiC layer, which is in the main area of the Schottky diode.

Another problem with the structures and processes disclosed in Ueno et al. is that during forward bias, the P-type ring injects minority carriers (holes) into the N-type SiC layer which adversely impacts the switching performance of the diode. As stated above, the key reason to use Schottky diodes rather than P-N junction diodes is to avoid the switching-speed issues associated with holes as the second type of current carrier.

Ueno et al. states that the problem of the injection of minority carriers from the P-type ring into the N-type SiC layer can be minimized by reducing the width of the P-type ring. However, reducing the width of the P-type ring requires the use of expensive micrometre and sub-micrometre photolithography.

To date, the structures disclosed in Ueno et al. have not been used in commercial devices, possibly because of difficulties associated with the need to create an Ohmic contact on the P-type epitaxial layer with the same metal and process that creates the critical Schottky contact on the N-type SiC.

OBJECT OF THE INVENTION

It is a preferred object of the present invention to provide a silicon carbide Schottky diode that addresses or at least ameliorates one or more of the aforementioned problems of the prior art and/or provides a useful commercial alternative.

It is a preferred object of the present invention to provide a silicon carbide Schottky diode with an edge termination structure to reduce the perimeter leakage well below the reverse-bias current of the active Schottky-diode area.

SUMMARY OF THE INVENTION

The present invention relates to silicon carbide Schottky diodes with edge termination structures to reduce the perimeter leakage and methods of production of such diodes.

In one form, although not necessarily the broadest form, the invention resides in a silicon carbide (SiC) Schottky diode comprising:

a layer of N-type SiC;

a layer of P-type SiC in contact with the layer of N-type SiC creating a P-N junction; and an anode in contact with both the layer of N-type SiC and the layer of P-type SiC creating Schottky contacts between the anode and both the layer of N-type SiC and the layer of P-type SiC wherein an edge of the layer of P-type SiC is electrically active and comprises a tapered negative charge density at the P-N junction.

Preferably, the layer of N-type SiC is an epitaxial layer.

Preferably, the layer of P-type SiC is an epitaxial layer.

Preferably, the edge of the layer of P-type SiC comprises a slope that slopes away from the anode to create the tapered negative charge density at the P-N junction.

Suitably, an angle ($\alpha$) of the slope for a given doping level ($N_P$) of the layer of P-type SiC, is such that $N_P \times \tan \alpha < 4 \times 10^{19}$ cm$^{-3}$.

Preferably, the anode is not in contact with the layer of P-type SiC in a region of the slope of the edge of the layer of P-type SiC.

Preferably, the layer of P-type SiC is in the form of a ring.

Preferably, a level of doping ($N_P$) of the layer of P-type SiC is in the range of about $10^{17}$ cm$^{-3}$ to about $10^{19}$ cm$^{-3}$.

Suitably, the product of a thickness and a doping concentration of the layer of P-type SiC is larger than $1.6 \times 10^{13}$ cm$^{-2}$ and the level of doping is lower than $10^{19}$ cm$^{-3}$.

In another form, although not necessarily the broadest form, the invention resides in a method of production of a silicon carbide Schottky diode comprising:

forming a layer of P-type SiC in contact with a layer of N-type SiC creating a P-N junction;

contacting an anode with both the layer of P-type SiC and the layer of N-type SiC creating Schottky contacts between the anode and both the layer of P-type SiC and the layer of N-type SiC;

forming an electrically active edge of the layer of P-type SiC comprising a tapered negative charge density at the P-N junction.

Preferably, the layer of N-type SiC and/or the layer of P-type SiC is an epitaxial layer.

Preferably, the method further comprises forming a slope in the edge of the layer of P-type SiC sloping away from the anode to create the tapered negative charge density at the P-N junction.

Preferably, the slope is formed by plasma etching using a soft etching mask in the form of photoresist.

Suitably, the method comprises hard-baking the photoresist at 140° C.

Suitably, the method comprises over-baking the photoresist at temperatures higher than a recommended hard-baking temperature, such as, but not limited to between 150° C. and 160° C.

Further forms and/or features of the present invention will become apparent from the following detailed description.

BRIEF DESCRIPTION OF THE DRAWINGS

In order that the invention may be readily understood and put into practical effect, reference will now be made to preferred embodiments of the present invention with reference to the accompanying drawings, wherein like reference numbers refer to identical elements. The drawings are provided by way of example only, wherein:

FIG. 1 shows the principle elements of a SiC Schottky diode known from the prior art;

FIG. 2 shows a SiC Schottky diode comprising an edge termination structure in the form of a P-type ring known from the prior art;

FIG. 3 shows a SiC Schottky diode comprising an edge termination and a Schottky contact between a metal anode and a P-type epitaxial ring according to an embodiment of the present invention;

FIGS. 4A and 4B show the functional difference between the SiC Schottky diode shown in FIG. 3 and the SiC Schottky diode known from Ueno et al.;

Figure 5A:
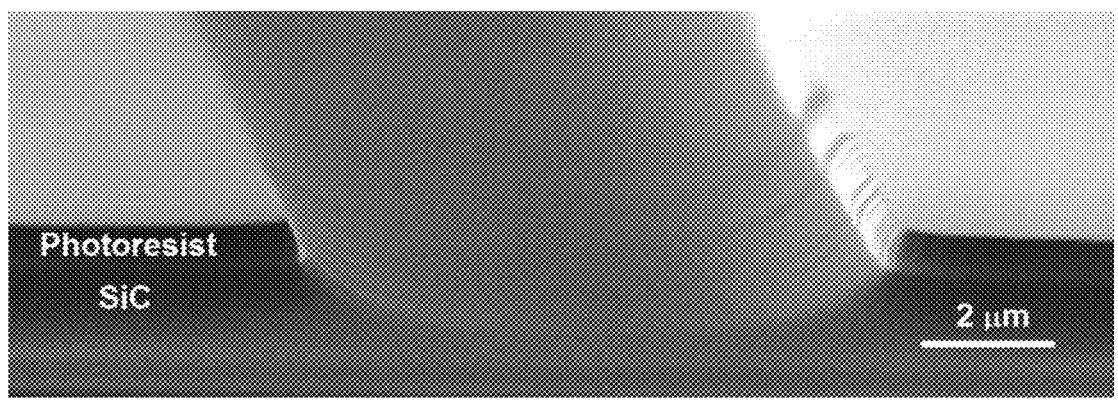
FIGS. 5A, 5B and 5C are SEM images of plasma-etched trenches, utilizing photoresist as a soft mask to create sloped edges in the etched epitaxial layer of P-type SiC.

Skilled addressees will appreciate that the drawings may be schematic and that elements in the drawings are illustrated for simplicity and clarity and have not necessarily been drawn to scale. For example, the relative dimensions of some of the elements in the drawings may be distorted to help improve understanding of embodiments of the present invention.

DETAILED DESCRIPTION OF THE INVENTION

The present invention relates to silicon carbide Schottky diodes with an edge termination structure to reduce the perimeter leakage and methods of production of such diodes. With reference to FIG. 3, a silicon carbide Schottky diode 300 according to embodiments of the present invention comprises a layer of N-type SiC 102 on an N+ type SiC substrate 104. In preferred embodiments, the layer of N-type SiC is an epitaxial layer. An Ohmic contact 108 is provided between the N+ type SiC substrate 104 and a circuit (not shown). The Schottky diode 300 comprises an edge termination structure in the form of a layer of P-type SiC 302, preferably in the form of a ring, in contact with the layer of N-type SiC 102, thus creating a P-N junction. In preferred embodiments, the layer of P-type SiC is an epitaxial layer. A Schottky-contact metal 112 of an anode 106 is in contact with the epitaxial layer of P-type SiC 302 creating a Schottky contact 304 between the metal anode 106 and the epitaxial layer of P-type SiC. The Schottky-contact metal 112 can be titanium (Ti), although other metals can be suitable. In the embodiment shown in FIG. 3, the anode 106 comprises an aluminium layer 106 and the Schottky-metal layer 112, which is in contact with the epitaxial layer of N-type SiC 102 and the epitaxial layer of P-type SiC 302 and the Schottky contact 304 is created between the metal layer 112 of the anode 106 and the epitaxial layer of P-type SiC 302.

Such an edge-termination structure is possible if the epitaxial layer of P-type SiC 302, grown on top of the N-type SiC layer 102, is utilized. In this case, a portion of the P-type epitaxial layer has to be removed from the main area of the diode to enable the Schottky contact 110 between the metal layer 112 of the anode 106 and the underlying epitaxial layer of N-type SiC 102 to be created. The methods of production of the present invention do not require the use of ion implantation techniques, thus achieving significant cost and reliability benefits.

The functional difference between prior-art structures known from Ueno et al. and the structures of the present invention is illustrated in FIGS. 4A and 4B. In some of the prior-art structures, as shown in FIG. 4A, the P-type edge termination ring 202 is in Ohmic contact with the metal 112 of the anode 106 of the diode, as illustrated by the resistor symbol 400 in the equivalent electric circuit. In contrast, FIG. 4B illustrates the Schottky contact between the metal 112 of the anode 106 of the diode and the P-type edge termination structure utilised in the present invention, as illustrated by the diode symbol 402 in the equivalent electric circuit.

Because of the wide energy gap of SiC, it is relatively easy to make Schottky contacts between a metal and both the N-type SiC layer 102 in the main diode area and the epitaxial layer of P-type SiC 302 used for the edge termination structure in this invention. This is so for both commercially available families of crystalline structures for SiC (or polytypes): 4H and 6H. The preferred polytype is 4H SiC because of favourable resistivity parameters. However, it is envisaged that the present invention would also be applicable to other polytypes of SiC.

Most metals that would be selected for the Schottky contact 110 with the N-type SiC would also create the Schottky contact 304 with the epitaxial layer of P-type SiC if (a) the surface doping of the epitaxial layer of P-type SiC is kept below $10^{19}$ cm$^{-3}$ and (b) the contact is not annealed at temperatures above 700° C. Both high doping levels and high-temperature annealing of the metal-semiconductor contact can create sufficiently high concentration of negative charge at the surface of the epitaxial layer of P-type SiC to enable the holes to tunnel through the reduced barrier width. This tunnelling of holes creates an Ohmic contact, and if it is avoided, the contact with most metals will be in the form of a Schottky contact. Titanium (Ti) is commonly used as the metal for SiC Schottky diodes, so in the preferred embodiment the Schottky contact 304 for the edge termination structure is the contact between the Ti layer 112 and the epitaxial layer of P-type SiC 302. In a preferred embodiment, the thickness of the epitaxial layer of P-type SiC 302 is 0.5 μm and the doping in the epitaxial layer of P-type SiC is $5 \times 10^{18}$ cm$^{-3}$.

Another feature of the present invention is the removal of a portion of the epitaxial layer of P-type SiC 302 from the active Schottky-diode area in a way that creates a sloped edge 306 of the epitaxial layer of P-type SiC 302, as shown in FIG. 3. The tapered or sloped edge 306 slopes away from the anode 106 and the anode 106 is not in contact with the layer of P-type SiC 302 in a region of the sloped edge 306. The process of local oxidation described by Ueno et al. can be used to remove a portion of the epitaxial layer of P-type SiC 302 from the active area and to create the sloped edge of the epitaxial layer of P-type SiC 302. However, this process is complex and therefore more expensive than is necessary.

In the preferred embodiments of the present invention, the removal of the epitaxial layer of P-type SiC 302 from the active area and creation of the sloped edge 306 having a tapered negative charge density is achieved by plasma etching. Plasma etching is usually performed with the aim of creating edges that are as steep as possible and there are many processes that are developed for that purpose. However, in the present invention, what is needed is to avoid the steep edges. The simplest technique to obtain sloped edges during plasma etching is to use a "soft" etching mask. In this context "soft" means an etching mask that in fact is etched at a similar rate as the underlying SiC. This way, the lateral etching of the mask is expanding the exposed SiC area as the etching progresses and creates the slope on the SiC ring that is not etched. In the preferred embodiment, photoresist is used as the soft mask. This is the simplest solution because no additional material needs to be deposited and subsequently etched. It is also the cleanest solution, because the use of metals as hard masks may contaminate the active Schottky-diode area (the area of the Schottky contact between the metal 112 and the layer of N-type SiC 102).

This contamination can create defects that may cause Schottky-diode leakage through these defects.

Figure 5B:
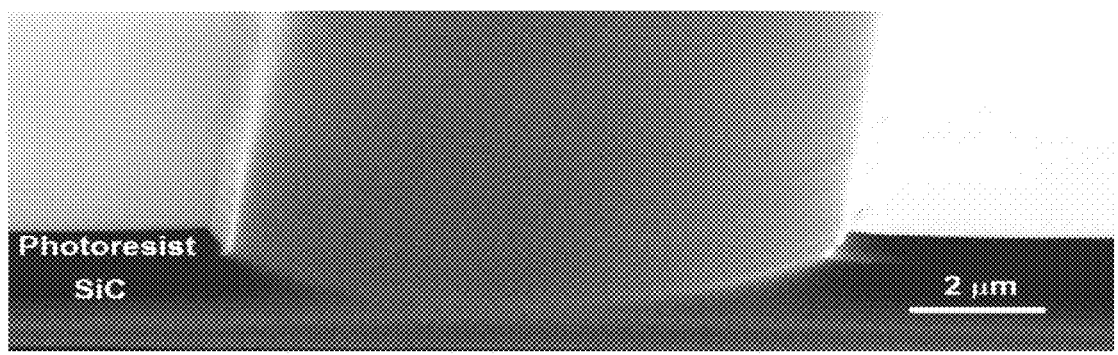
Figure 5C:
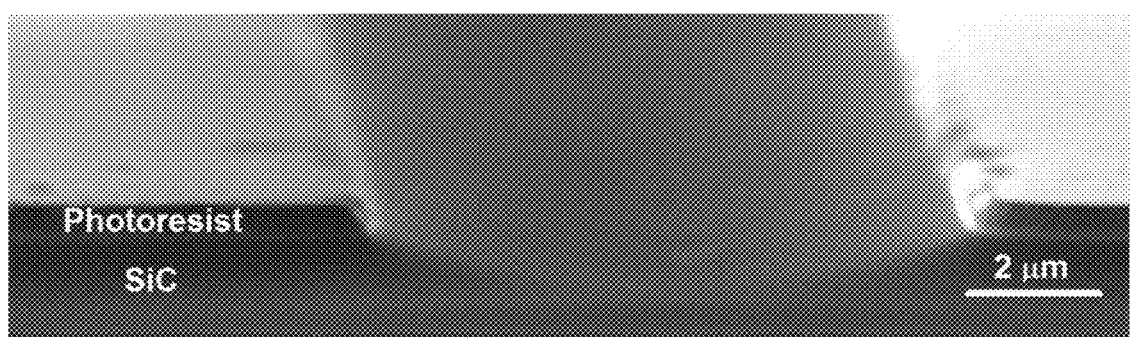

The etch ratio of photoresist is similar to the etch ratio of SiC and, as a consequence, it will create a slope of around 45°. The SEM image of the plasma-etched trench with photoresist as the mask, shown in FIG. 5A, illustrates the slope of the SiC edges that can be obtained by this technique. For the case shown in FIG. 5A, the hard-baking temperature of the photoresist was 140° C. Using photoresist as the etching mask, it is possible to obtain even smaller angles. One technique is to bake the resist at higher temperatures than the recommended hard-baking temperature. This "overbaking" will create sloped edges in the photoresist itself, which then leads to a reduced slope of the etched side of the underlying SiC. This is illustrated by the SEM images in FIGS. 5B and 5C, which show plasma-etched trenches with photoresist as the mask that was hard-baked at higher temperatures: 150° C. (FIG. 5B) and 160° C. (FIG. 5C). It is however envisaged that other "overbaking" temperatures can be employed, such as temperatures between 150° C. and 160° C., below 150° C. and above 160° C. where such temperatures constitute "overbaking". In various embodiments of the present invention, the angle ($\alpha$) of the sloped edge 306 of the epitaxial layer of P-type SiC 302 is equal to or less than around 80°.

An angle ($\alpha$) of the sloped edge 306 and a level of doping ($N_P$) of the P-type SiC are determined so that the tapered charge density changes from 0 at the tip of the sloped edge 306 of the P-type SiC to no more than the maximum charge density of interest, over no less than a lateral distance $W_L$=4 nm away from the tip. The maximum charge density of interest is $N_{max}=(\varepsilon_r \times \varepsilon_0 \times E_c)/q$, where $\varepsilon_r$ is the relative dielectric constant of SiC, $\varepsilon_0$ is the vacuum permittivity, and $E_c$ is the critical electric field of SiC. For the case of 4H SiC, the maximum charge density of interest is around $N_{max}=1.6 \times 10^{13}$ cm$^{-2}$. For example, an angle of the sloped edge 306 $\alpha$=80° corresponds to doping level ($N_P$) of the P-type SiC of $N_P = N_{max}/(W_L \times \tan \alpha) \approx 7 \times 10^{18}$ cm$^{-3}$. The thickness ($t_P$) of the P-type SiC layer should be larger than $W_L \times \tan \alpha$ and the width of the P-type ring should be larger than $W_L$ to ensure that the maximum charge density of interest is reached within the sloped region, making the sloped edge 306 of the P-type SiC electrically active. It is envisaged that the level of doping ($N_P$) of the layer of P-type SiC can be in the range of about $10^{17}$ cm$^{-3}$ to about $10^{19}$ cm$^{-3}$ for a range of angles ($\alpha$) of the sloped edge 306. Expressed another way, the product of a thickness of the layer of P-type SiC and a doping concentration of the layer of P-type SiC is larger than $1.6 \times 10^{13}$ cm$^{-2}$ and the level of doping ($N_P$) is lower than $10^{19}$ cm$^{-3}$.

In the absence of leakage through defects, the measured reverse-bias current of a single diode ($I_R$) consists of current through the active area ($I_A$) and through the edge-termination at the perimeter ($I_P$):

$$I_R = I_P + I_A \quad \text{Eqn. (1)}$$

The standard way of measuring the perimeter leakage $I_P$ is to fabricate Schottky diodes with the same active area (A), but with different perimeters (P) on the same chip and with the same process. This way, the current density in the active area ($J_A = I_A/A$) and the current per unit length at the termination edge ($J_P = I_P/P$) are the same for all diodes, whereas the total perimeter current $I_P$ is different because the perimeters are different. This difference is used to separate the perimeter current from the total measured current by a technique based on the following mathematical transformation:

$$I_R = J_P P + J_A A \quad \text{Eqn. (2)}$$

$$\frac{I_R}{A} = J_P \frac{P}{A} + J_A \quad \text{Eqn. (3)}$$

Figure 6:
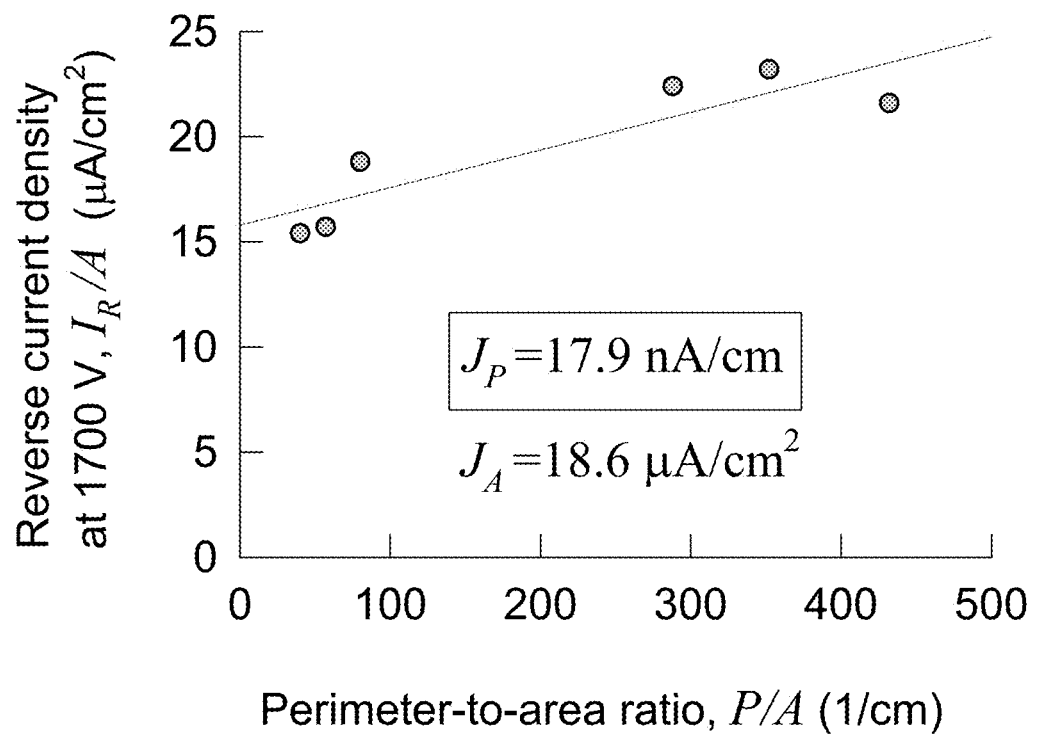
FIG. 6 shows electrical measurements of the perimeter leakage per unit length ($J_P$) of SiC Schottky diodes according to embodiments of the present invention.

Equation (3) is in the form y=ax+b. In the absence of leakage through defects, the plot of current density (y=$I_R$/A) versus the perimeter-to-area ratios (x=P/A) is linear, as shown in FIG. 6 for Schottky diodes fabricated with the edge termination structure according to the present invention as disclosed herein. The slope of the straight line is equal to the perimeter current per unit length ($J_P$) and its intercept with the y axis is equal to the current density through the main diode area ($J_A$). As can be seen from FIG. 6, the measured perimeter leakage per unit length is $J_P$=17.9 nA/cm, whereas the measured reverse-bias current density is $J_A$=18.6 µA/cm$^2$. These numbers are for the reverse-bias voltage of 1700 V and for 20-µm thick N-type drift region, doped at $5 \times 10^{15}$ cm$^{-3}$. The thickness of the epitaxial layer of P-type SiC 302 for the termination ring was 0.5 µm and its doping was $5 \times 10^{18}$ cm$^{-3}$. The depth of the trench etching to define the epitaxial layer of P-type SiC 302 was 0.75 µm. With the measured values of $J_P$ and $J_A$, the fraction of the perimeter leakage can be determined for Schottky diodes with specific active areas, designed for specific forward-current capabilities. For example, for a 2 mm×2 mm active area, A=4 mm$^2$ and P=4×2=8 mm. This means that $I_P = J_P P$=14.3 nA and $I_A = J_A A$=744 nA. The fraction of the perimeter current is $100 \times I_P/(I_P + I_A)$=1.9%. This demonstrates that the perimeter leakage current is practically eliminated, confirming the functionality of the SiC Schottky diodes comprising the edge-termination structure as described herein.

Hence, embodiments of the present invention provide silicon carbide (SiC) Schottky diodes with edge termination structures which address or at least ameliorate one or more of the aforementioned problems of prior art Schottky diodes.

For example, the reverse bias of the Schottky contact between the metal and the P-type epi ring when the main Schottky diode (the contact between the metal and the layer of N-type SiC) is forward biased prevents injection of holes from the P-type ring into the N-type SiC by this forward-biased P-N junction.

The use of a Schottky contact rather than Ohmic contact between the metal and the P-type epi ring eliminates the problem of hole injection completely. As a consequence, the width of the P-type ring can be sufficiently large to avoid the need for expensive micrometre and sub-micrometre photolithography techniques.

The sloping edge of the epitaxial layer of the P-type SiC creates a tapered negative charge at the P-N junction providing the significant advantage of reducing the electric field at the electrically active edge.

Significant cost and reliability benefits are achievable by manufacturing the SiC Schottky diode without the use of ion implantation techniques to produce the embedded P-type ring.

Electrical measurements of the perimeter leakage per unit length ($J_P$) of Schottky diodes with edge termination structures according to the present invention demonstrate that the edge termination structure practically eliminates the perimeter leakage in comparison to the reverse-bias current through the active diode area.

In this specification, the terms "comprises", "comprising" or similar terms are intended to mean a non-exclusive inclusion, such that an apparatus that comprises a list of elements does not include those elements solely, but may well include other elements not listed.

The reference to any prior art in this specification is not, and should not be taken as, an acknowledgement, or any form of suggestion that the prior art forms part of the common general knowledge.

Throughout the specification the aim has been to describe the present invention without limiting the invention to any one embodiment or specific collection of features. Persons skilled in the relevant art may realize variations from the specific embodiments that will nonetheless fall within the scope of the present invention.

The invention claimed is:

1. A silicon carbide (SiC) Schottky diode comprising:
   a layer of N-type SiC;
   a layer of P-type SiC in contact with the layer of N-type SiC creating a P-N junction; and
   an anode in contact with both the layer of N-type SiC and the layer of P-type SiC creating Schottky contacts between the anode and both the layer of N-type SiC and the layer of P-type SiC, wherein an edge of the layer of P-type SiC is electrically active and comprises a slope that is sloping away from the anode to create a tapered negative charge density at the P-N junction.

2. The silicon carbide (SiC) Schottky diode of claim 1, wherein the N-type SiC layer is an epitaxial layer.

3. The silicon carbide (SiC) Schottky diode of claim 1, wherein the P-type SiC layer is an epitaxial layer.

4. The silicon carbide (SiC) Schottky diode of claim 1, wherein an angle ($\alpha$) of the slope, for a given doping level ($N_P$) of the layer of P-type SiC, is such that $N_P \times \tan\alpha < 4 \times 10^{19}$ cm$^{-3}$.

5. The silicon carbide (SiC) Schottky diode of claim 1, wherein the anode is not in contact with the layer of P-type SiC in a region of the slope of the edge of the layer of P-type SiC.

6. The silicon carbide (SiC) Schottky diode of claim 1, wherein the layer of P-type SiC is in the form of a ring.

7. The silicon carbide (SiC) Schottky diode of claim 1, wherein a level of doping ($N_P$) of the layer of P-type SiC is in the range of about $10^{17}$ cm$^{-3}$ to about $10^{19}$ cm$^{-3}$.

8. The silicon carbide (SiC) Schottky diode of claim 1, wherein the product of a thickness and a doping concentration of the layer of P-type SiC is larger than $1.6 \times 10^{13}$ cm$^{-2}$ and the level of doping is lower than $10^{19}$ cm$^{-3}$.

9. A method of production of a silicon carbide Schottky diode comprising:
   forming a layer of P-type SiC in contact with a layer of N-type SiC creating a P-N junction;
   contacting an anode with both the layer of N-type SiC and the layer of P-type SiC creating Schottky contacts between the anode and both the layer of N-type SiC and the layer of P-type SiC; and
   forming an electrically active edge of the layer of P-type SiC by forming a slope that is sloping away from the anode to create a tapered negative charge density at the P-N junction.

10. The method of claim 9, wherein the layer of N-type SiC and/or the layer of P-type SiC is an epitaxial layer.

11. The method of claim 9, wherein forming the slope in the edge of the layer of P-type SiC comprises plasma etching using a soft etching mask in the form of photoresist.

12. The method of claim 11, further comprising hard-baking the photoresist, for example at 140° C.

13. The method of claim 11, further comprising over-baking the photoresist at temperatures higher than a recommended hard-baking temperature, such as, but not limited to between 150° C. and 160° C.

* * * * *